US012638895B2

(12) United States Patent
Amid et al.

(10) Patent No.: US 12,638,895 B2
(45) Date of Patent: May 26, 2026

(54) MECHANISM FOR POWER SHARING AND ALLOCATION AMONG DEVICE COMPONENTS

(71) Applicant: NVIDIA Corp., Santa Clara, CA (US)

(72) Inventors: Alon Amid, Haifa (IL); Aleksandr Frid, San Francisco, CA (US); Ben Pei En Tsai, Helsinki (FI); Alon Sadan, Zichron Yaakov (IL)

(73) Assignee: NVIDIA Corp., Santa Clara, CA (US)

( * ) Notice: Subject to any disclaimer, the term of this patent is extended or adjusted under 35 U.S.C. 154(b) by 134 days.

(21) Appl. No.: 18/782,612

(22) Filed: Jul. 24, 2024

(65) Prior Publication Data

US 2026/0029829 A1     Jan. 29, 2026

(51) Int. Cl.
G06F 11/30 (2006.01)
G06F 1/28 (2006.01)
*G06F 1/3203* (2019.01)
*G11C 16/30* (2006.01)

(52) U.S. Cl.
CPC .............. *G06F 1/28* (2013.01); *G06F 1/3203* (2013.01); *G11C 16/30* (2013.01)

(58) Field of Classification Search
CPC .................................. G06F 1/28; G11C 16/30
USPC ......................................................... 713/320
See application file for complete search history.

(56) References Cited

U.S. PATENT DOCUMENTS

| | | | | | |
|---|---|---|---|---|---|
| 7,313,706 | B2 * | 12/2007 | Williams | .............. | G06F 1/3296 |
| | | | | | 713/340 |
| 7,496,772 | B1 * | 2/2009 | Nguyen | ................ | G06F 1/3203 |
| | | | | | 713/340 |
| 9,063,733 | B2 * | 6/2015 | Barnette | ................... | G06F 1/28 |
| 2002/0140964 | A1 * | 10/2002 | Goto | ...................... | G06K 15/00 |
| | | | | | 358/1.14 |
| 2007/0050650 | A1 * | 3/2007 | Conroy | ..................... | G06F 1/26 |
| | | | | | 713/300 |
| 2010/0064151 | A1 * | 3/2010 | Saeki | .................... | G06F 1/3203 |
| | | | | | 713/300 |
| 2012/0023345 | A1 * | 1/2012 | Naffziger | ................ | G06F 1/324 |
| | | | | | 713/340 |
| 2014/0068282 | A1 * | 3/2014 | Jenne | .................... | G06F 1/3234 |
| | | | | | 713/300 |
| 2016/0085596 | A1 * | 3/2016 | Nakagawa | ............ | G06F 9/5094 |
| | | | | | 718/104 |
| 2017/0031431 | A1 * | 2/2017 | Khatri | ................... | G06F 1/3246 |
| 2019/0086982 | A1 * | 3/2019 | Priyadarshi | ........... | G06F 1/3206 |
| 2019/0361744 | A1 * | 11/2019 | Koda | ...................... | G06F 1/329 |
| 2019/0377395 | A1 * | 12/2019 | Kaburlasos | ............... | G06F 1/28 |

(Continued)

*Primary Examiner* — Volvick Derose
(74) *Attorney, Agent, or Firm* — Carnelian Law LLC

(57) ABSTRACT

Systems including a power supply and multiple chips or die, wherein settings may be configured that when applied to a first one of the chips or die configure the first chip or die to associate a power allocation limit with at least a second one of the chips or die, wherein a sum of the power allocation limit and a power consumption limit of the first chip or die exceeds a total power capacity of the power supply. The systems operate the first chip or die at a lower priority than the other chips or die for receiving operating power from the power supply, and the first chip or die is operated as a master controller of allocation of the operating power from the power supply to the first chip or die and to the other chips or die.

20 Claims, 6 Drawing Sheets

(56)                    References Cited

U.S. PATENT DOCUMENTS

| | | | |
|---|---|---|---|
| 2020/0089298 A1* | 3/2020 | Lin | G06F 11/3058 |
| 2021/0382804 A1* | 12/2021 | Alrod | G11C 8/12 |

* cited by examiner

MECHANISM FOR POWER SHARING AND ALLOCATION AMONG DEVICE COMPONENTS

BACKGROUND

Devices may utilize a number of different integrated circuits, each consuming power. Some devices may utilize multiple data processing chips or packages. For example, many computing devices comprise at least one general purpose data processor (central processing unit, i.e. CPU) and at least one graphics processing unit (GPU). These integrated circuits may share a common power supply and may together consume a substantial amount of the power available from the shared supply.

Conventional static power-sharing mechanisms may not efficiently prioritize the power budget for each component under various load conditions that may occur during operation. For example, centralized power management mechanisms may prioritize the power consumption in manners that require the exchange of signals (e.g., to indicate power needs) between components or between components and the central power controller. Some conventional power sharing mechanisms may incur undesirable latencies and/or software execution burdens on particular components, such as the CPU.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
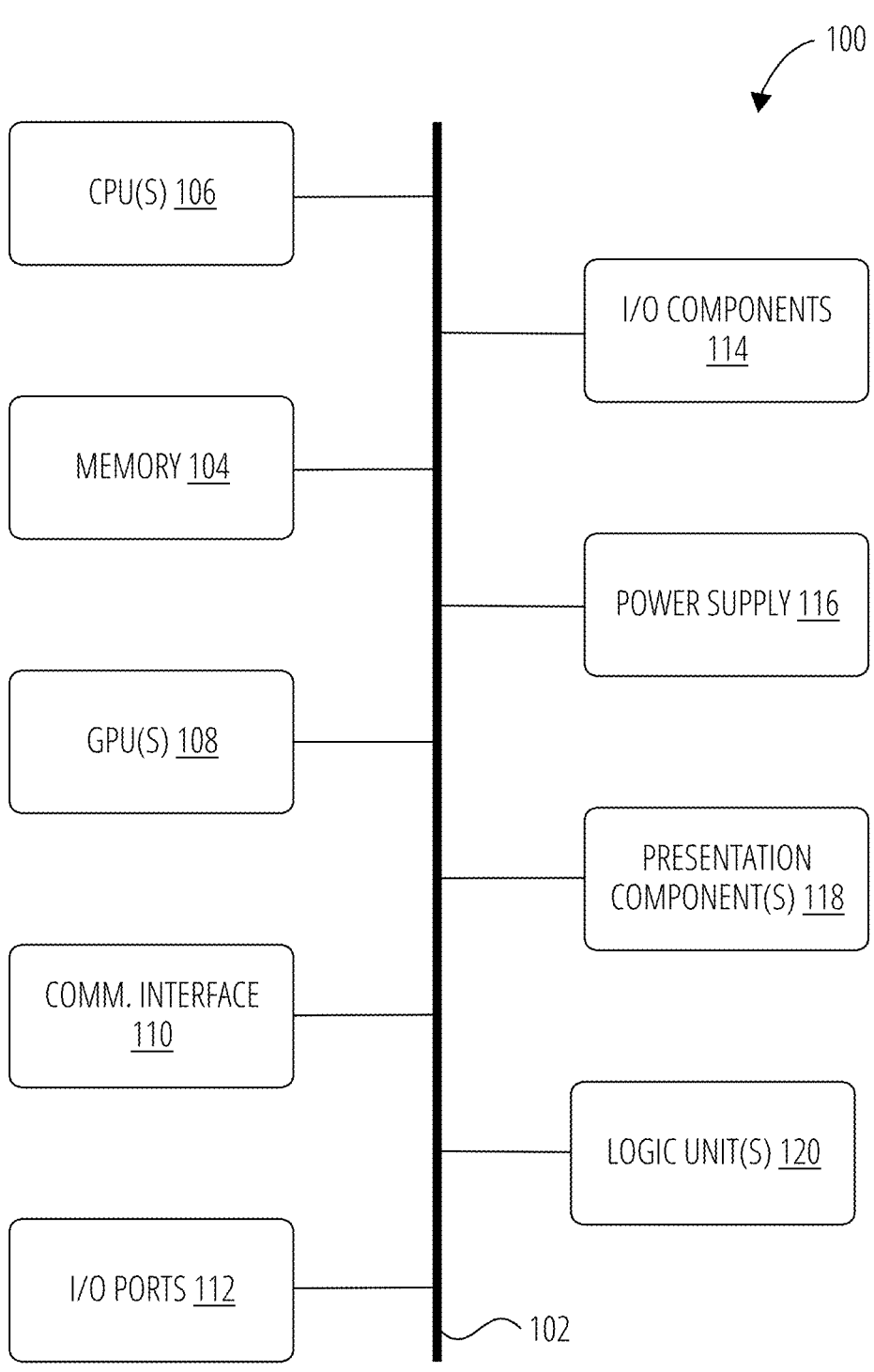
FIG. 1 is a block diagram of an example computing system 100 suitable for use in implementing some embodiments of the present disclosure.

The following description utilizes one or more CPU and one or more GPU as examples in various power sharing and power prioritizing scenarios. However the disclosed mechanisms apply more generally to power allocation and power prioritization between any two components sharing a common power supply in a device. For example, the disclosed mechanisms may be utilized between two or more integrated circuit die in a package, between two or more integrated circuit chips (packaged and pinned die), and between combinations of die and chips.

A common operating scenario in devices utilizing, for example, at least one CPU and at least one GPU, is the execution of a workload for which the (one or more) CPU is not fully utilized and the (one or more) GPU is heavily utilized. In this scenario, the GPU may need to draw (e.g., much) more power than a static power-sharing allocation may accommodate to meet workload performance demands.

In another scenario, a workload with high performance and power demand is executing on the GPU and also utilizing a small number of CPU computing cores. One or more other workloads are executing on other CPU cores. In this scenario, both the CPU and the GPU contend for power from the power source for executing the high performance workload, and prioritization in power allocation between the CPU and the GPU may be beneficial to workload performance.

In conventional computer systems, CPU power demand may be prioritized over GPU power demand. In workload co-scheduling scenarios, prioritizing the CPU in power allocation may result in noticeable performance loss of an accelerated application (a workload with high-performance requirements, such as artificial intelligence training or inference) executing on, or primarily on, the GPU. It may be beneficial to prioritize the GPU for power-allocation in these scenarios so that the accelerated application executes with improved performance.

Disclosed herein are mechanisms to dynamically (based on extant operating conditions) allocate power among integrated circuits. Control over power consumption may be dynamically shifted between, for example one or more GPU and one or more CPU, by way of a setting in memory (e.g., a non-volatile memory). To prioritize workloads on the CPU(s), the GPU(s) may control the power allocation, and to prioritize workloads on the GPU(s), the CPU(s) may control the power allocation.

The dynamic assignment of control over the power budget enables improved prioritization of workloads between the integrated circuit components and overall more efficient allocation of power to workloads with the highest performance requirements. The utilization and overhead of dedicated execution-time software (e.g., in the device operating system) may be reduced or obviated.

In one aspect, a setting is configured in a memory of a computing device or integrated circuit, e.g., in a flash memory. This setting indicates the integrated circuit(s), or the type of integrated circuit(s), to receive power priority over others. The setting may in one embodiment be applied to and acted upon by the component(s) that are not prioritized, and not the prioritized component(s). If a prioritized component needs more power during system operation, non-prioritized components back off (throttle) their power consumption on their own initiative, so that the prioritized component may draw the power it needs from the fixed overall power budget. The prioritized and less-prioritized components need not interact with one another to effectuate this process.

FIG. 1 is a block diagram of an example computing system 100 suitable for use in implementing some embodiments of the present disclosure. The computing system 100 may include an interconnect system 102 that directly or indirectly couples the following devices: memory 104, one or more central processing units (CPU(s) 106), one or more graphics processing units (GPU(s) 108), a communication interface 110, input/output ports (I/O ports 112), input/output components (I/O components 114), a power supply 116, one or more presentation component(s) 118 (e.g., display(s)), and one or more logic unit(s) 120.

Although the various blocks of FIG. 1 are shown as connected via the interconnect system 102 with lines, this is not intended to be limiting and is for clarity only. For example, in some embodiments, a presentation component 118, such as a display device, may be considered an I/O component 114 (e.g., if the display is a touch screen). As another example, the CPU(s) 106 and/or GPU(s) 108 may include memory (e.g., the memory 104 may be representative of a storage device in addition to the memory of the GPU(s) 108, the CPU(s) 106, and/or other components). In other words, the computing device of FIG. 1 is merely illustrative. Distinction is not made between such categories as "workstation," "server," "laptop," "desktop," "tablet," "client device," "mobile device," "hand-held device," "game console," "electronic control unit (ECU)," "virtual reality system," and/or other device or system types, as all are contemplated within the scope of the computing device of FIG. 1.

The interconnect system 102 may represent one or more links or busses, such as an address bus, a data bus, a control bus, or a combination thereof. The interconnect system 102 may include one or more bus or link types, such as an industry standard architecture (ISA) bus, an extended industry standard architecture (EISA) bus, a video electronics standards association (VESA) bus, a peripheral component interconnect (PCI) bus, a peripheral component interconnect express (PCIe) bus, and/or another type of bus or link. In some embodiments, there are direct connections between components. As an example, the CPU(s) 106 may be directly connected to the memory 104. Further, the CPU(s) 106 may be directly connected to the GPU(s) 108. Where there is direct, or point-to-point connection between components, the interconnect system 102 may include a PCIe link to carry out the connection. In these examples, a PCI bus need not be included in the computing system 100.

The memory 104 may include any of a variety of computer-readable media. The computer-readable media may be any available media that may be accessed by the computing system 100. The computer-readable media may include both volatile and nonvolatile media, and removable and non-removable media. By way of example, and not limitation, the computer-readable media may comprise computer-storage media and communication media.

The computer-storage media may include both volatile and nonvolatile media and/or removable and non-removable media implemented in any method or technology for storage of information such as computer-readable instructions, data structures, program modules, and/or other data types. For example, the memory 104 may store computer-readable instructions (e.g., that represent a program(s) and/or a program element(s), such as an operating system. Computer-storage media may include, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may be accessed by computing system 100. As used herein, computer storage media does not comprise signals per se.

The computer storage media may embody computer-readable instructions, data structures, program modules, and/or other data types in a modulated data signal such as a carrier wave or other transport mechanism and includes any information delivery media. The term "modulated data signal" may refer to a signal that has one or more of its characteristics set or changed in such a manner as to encode information in the signal. By way of example, and not limitation, the computer storage media may include wired media such as a wired network or direct-wired connection, and wireless media such as acoustic, RF, infrared and other wireless media. Combinations of any of the above should also be included within the scope of computer-readable media.

The CPU(s) 106 may be configured to execute at least some of the computer-readable instructions to control one or more components of the computing system 100 to perform one or more of the methods and/or processes described herein. The CPU(s) 106 may each include one or more cores (e.g., one, two, four, eight, twenty-eight, seventy-two, etc.) that are capable of handling a multitude of software threads simultaneously. The CPU(s) 106 may include any type of processor, and may include different types of processors depending on the type of computing system 100 implemented (e.g., processors with fewer cores for mobile devices and processors with more cores for servers). For example, depending on the type of computing system 100, the processor may be an Advanced RISC Machines (ARM) processor implemented using Reduced Instruction Set Computing (RISC) or an x86 processor implemented using Complex Instruction Set Computing (CISC). The computing system 100 may include one or more CPU(s) 106 in addition to one or more microprocessors or supplementary co-processors, such as math co-processors.

In addition to or alternatively from the CPU(s) 106, the GPU(s) 108 may be configured to execute at least some of the computer-readable instructions to control one or more components of the computing system 100 to perform one or more of the methods and/or processes described herein. One or more of the GPU(s) 108 may be an integrated GPU (e.g., with one or more of the CPU(s) 106 and/or one or more of the GPU(s) 108 may be a discrete GPU. In embodiments, one or more of the GPU(s) 108 may be a coprocessor of one or more of the CPU(s) 106. The GPU(s) 108 may be used by the computing system 100 to render graphics (e.g., 3D graphics) or perform general purpose computations. For example, the GPU(s) 108 may be used for General-Purpose computing on GPUs (GPGPU). The GPU(s) 108 may include hundreds or thousands of cores that are capable of handling hundreds or thousands of software threads simultaneously. The GPU(s) 108 may generate pixel data for output images in response to rendering commands (e.g., rendering commands from the CPU(s) 106 received via a host interface). The GPU(s) 108 may include graphics memory, such as display memory, for storing pixel data or any other suitable data, such as GPGPU data. The display memory may be included as part of the memory 104. The GPU(s) 108 may include two or more GPUs operating in parallel (e.g., via a link). The link may directly connect the GPUs (e.g., using NVLINK) or may connect the GPUs through a switch (e.g., using NVSwitch). When combined together, each GPU 108 may generate pixel data or GPGPU data for different portions of an output or for different outputs (e.g., a first GPU for a first image and a second GPU for a second image). Each GPU may include its own memory, or may share memory with other GPUs.

In addition to or alternatively from the CPU(s) 106 and/or the GPU(s) 108, the logic unit(s) 120 may be configured to execute at least some of the computer-readable instructions to control one or more components of the computing system 100 to perform one or more of the methods and/or processes described herein. In embodiments, the CPU(s) 106, the GPU(s) 108, and/or the logic unit(s) 120 may discretely or jointly perform any combination of the methods, processes and/or portions thereof. One or more of the logic unit(s) 120 may be part of and/or integrated in one or more of the CPU(s) 106 and/or the GPU(s) 108 and/or one or more of the logic unit(s) 120 may be discrete components or otherwise external to the CPU(s) 106 and/or the GPU(s) 108. In embodiments, one or more of the logic unit(s) 120 may be a coprocessor of one or more of the CPU(s) 106 and/or one or more of the GPU(s) 108.

Examples of the logic unit(s) 120 include one or more processing cores and/or components thereof, such as Tensor Cores (TCs), Tensor Processing Units (TPUs), Pixel Visual Cores (PVCs), Vision Processing Units (VPUs), Graphics Processing Clusters (GPCs), Texture Processing Clusters (TPCs), Streaming Multiprocessors (SMs), Tree Traversal Units (TTUs), Artificial Intelligence Accelerators (AIAs), Deep Learning Accelerators (DLAs), Arithmetic-Logic Units (ALUs), Application-Specific Integrated Circuits (ASICs), Floating Point Units (FPUs), input/output (I/O) elements, peripheral component interconnect (PCI) or peripheral component interconnect express (PCIe) elements, and/or the like.

The communication interface 110 may include one or more receivers, transmitters, and/or transceivers that enable the computing system 100 to communicate with other computing devices via an electronic communication network, included wired and/or wireless communications. The communication interface 110 may include components and functionality to enable communication over any of a number of different networks, such as wireless networks (e.g., Wi-Fi, Z-Wave, Bluetooth, Bluetooth LE, ZigBee, etc.), wired networks (e.g., communicating over Ethernet or InfiniBand), low-power wide-area networks (e.g., LoRaWAN, SigFox, etc.), and/or the Internet.

The I/O ports 112 may enable the computing system 100 to be logically coupled to other devices including the I/O components 114, the presentation component(s) 118, and/or other components, some of which may be built in to (e.g., integrated in) the computing system 100. Illustrative I/O components 114 include a microphone, mouse, keyboard, joystick, game pad, game controller, satellite dish, scanner, printer, wireless device, etc. The I/O components 114 may provide a natural user interface (NUI) that processes air gestures, voice, or other physiological inputs generated by a user. In some instances, inputs may be transmitted to an appropriate network element for further processing. An NUI may implement any combination of speech recognition, stylus recognition, facial recognition, biometric recognition, gesture recognition both on screen and adjacent to the screen, air gestures, head and eye tracking, and touch recognition (as described in more detail below) associated with a display of the computing system 100. The computing system 100 may be include depth cameras, such as stereoscopic camera systems, infrared camera systems, RGB camera systems, touchscreen technology, and combinations of these, for gesture detection and recognition. Additionally, the computing system 100 may include accelerometers or gyroscopes (e.g., as part of an inertia measurement unit (IMU)) that enable detection of motion. In some examples, the output of the accelerometers or gyroscopes may be used by the computing system 100 to render immersive augmented reality or virtual reality.

The power supply 116 may include a hard-wired power supply, a battery power supply, or a combination thereof. The power supply 116 may provide power to the computing system 100 to enable the components of the computing system 100 to operate.

The presentation component(s) 118 may include a display (e.g., a monitor, a touch screen, a television screen, a heads-up-display (HUD), other display types, or a combination thereof), speakers, and/or other presentation components. The presentation component(s) 118 may receive data from other components (e.g., the GPU(s) 108, the CPU(s) 106, etc.), and output the data (e.g., as an image, video, sound, etc.).

Network environments suitable for use in implementing embodiments of the disclosure may include one or more client devices, servers, network attached storage (NAS), other backend devices, and/or other device types. The client devices, servers, and/or other device types (e.g., each device) may be implemented on one or more instances of the computing system 100 of FIG. 1—e.g., each device may include similar components, features, and/or functionality of the computing system 100.

Components of a network environment may communicate with each other via a network(s), which may be wired, wireless, or both. The network may include multiple networks, or a network of networks. By way of example, the network may include one or more Wide Area Networks (WANs), one or more Local Area Networks (LANs), one or more public networks such as the Internet and/or a public switched telephone network (PSTN), and/or one or more private networks. Where the network includes a wireless telecommunications network, components such as a base station, a communications tower, or even access points (as well as other components) may provide wireless connectivity.

Compatible network environments may include one or more peer-to-peer network environments—in which case a server may not be included in a network environment—and one or more client-server network environments—in which case one or more servers may be included in a network environment. In peer-to-peer network environments, functionality described herein with respect to a server(s) may be implemented on any number of client devices.

In at least one embodiment, a network environment may include one or more cloud-based network environments, a distributed computing environment, a combination thereof, etc. A cloud-based network environment may include a framework layer, a job scheduler, a resource manager, and a distributed file system implemented on one or more of servers, which may include one or more core network servers and/or edge servers. A framework layer may include a framework to support software of a software layer and/or one or more application(s) of an application layer. The software or application(s) may respectively include web-based service software or applications. In embodiments, one or more of the client devices may use the web-based service software or applications (e.g., by accessing the service software and/or applications via one or more application programming interfaces (APIs)). The framework layer may be, but is not limited to, a type of free and open-source software web application framework such as that may use a distributed file system for large-scale data processing (e.g., "big data").

A cloud-based network environment may provide cloud computing and/or cloud storage that carries out any combination of computing and/or data storage functions described herein (or one or more portions thereof). Any of these various functions may be distributed over multiple locations from central or core servers (e.g., of one or more data centers that may be distributed across a state, a region, a country, the globe, etc.). If a connection to a user (e.g., a client device) is relatively close to an edge server(s), a core server(s) may designate at least a portion of the functionality to the edge server(s). A cloud-based network environment may be private (e.g., limited to a single organization), may be public (e.g., available to many organizations), and/or a combination thereof (e.g., a hybrid cloud environment).

The client device(s) may include at least some of the components, features, and functionality of the example computing system 100 described herein with respect to FIG. 1. By way of example and not limitation, a client device may be embodied as a Personal Computer (PC), a laptop computer, a mobile device, a smartphone, a tablet computer, a smart watch, a wearable computer, a Personal Digital Assistant (PDA), an MP3 player, a virtual reality headset, a Global Positioning System (GPS) or device, a video player, a video camera, a surveillance device or system, a vehicle, a boat, a flying vessel, a virtual machine, a drone, a robot, a handheld communications device, a hospital device, a gaming device or system, an entertainment system, a vehicle computer system, an embedded system controller, a remote control, an appliance, a consumer electronic device, a workstation, an edge device, any combination of these delineated devices, or any other suitable device.

Systems with multiple GPUs and CPUs are used in a variety of industries as developers expose and leverage more parallelism in applications such as artificial intelligence computing. High-performance GPU-accelerated systems with tens to many thousands of compute nodes are deployed in data centers, research facilities, and supercomputers to solve ever larger problems. As the number of processing devices within the high-performance systems increases, the communication and data transfer mechanisms need to scale to support the increased bandwidth.

Figure 2:
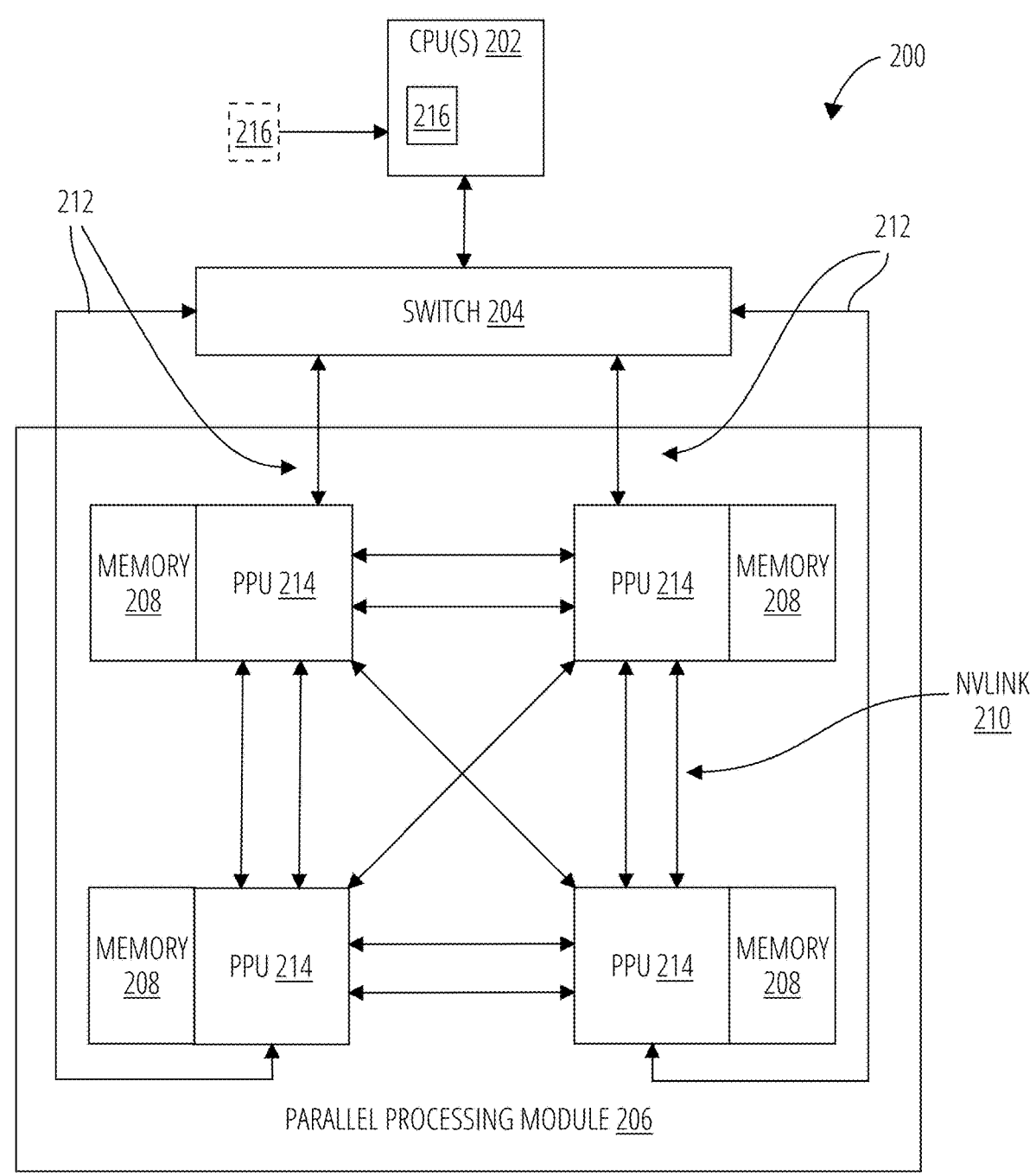
FIG. 2 depicts an exemplary processing system 200 in accordance with one embodiment.

FIG. 2 is a conceptual diagram of a processing system 200 implemented utilizing parallel processing units 214 in accordance with an embodiment. Each parallel processing unit 214 comprises a multi-threaded processor that is implemented on one or more integrated circuit devices. A parallel processing unit 214 comprises a latency hiding architecture designed to process many threads in parallel. A thread (e.g., a thread of execution) is an instantiation of a set of instructions configured to be executed by the parallel processing units 214. In an embodiment, a parallel processing unit 214 comprises a graphics processing unit (GPU) configured to implement a graphics rendering pipeline for processing three-dimensional (3D) graphics data in order to generate two-dimensional (2D) image data for display on a display device such as a liquid crystal display (LCD) device. In other embodiments, a parallel processing unit 214 may be utilized for performing general-purpose computations. While one exemplary parallel processor is provided herein for illustrative purposes, it should be strongly noted that such processor is set forth for illustrative purposes only, and that any processor may be employed to supplement and/or substitute for the same.

One or more parallel processing unit 214 may be configured to accelerate thousands of High Performance Computing (HPC), data center, and machine learning applications. A parallel processing unit 214 may be configured to accelerate numerous deep learning systems and applications including autonomous vehicle platforms, deep learning, high-accuracy speech, image, and text recognition systems, intelligent video analytics, molecular simulations, drug discovery, disease diagnosis, weather forecasting, big data analytics, astronomy, molecular dynamics simulation, financial modeling, robotics, factory automation, real-time language translation, online search optimizations, and personalized user recommendations, and the like.

Each parallel processing unit 214 may be coupled to a host processor (e.g., general-purpose processor 202) and/or other parallel processing units 214 via one or more high-speed NVLink 210 interconnects. The parallel processing units 214 may be coupled to a host processor (e.g., general-purpose processor 202) or other peripheral devices via an interconnect 212. The parallel processing units 214 may also be coupled to local memory comprising a number of memory 208 devices. In an embodiment, the local memory may comprise a number of dynamic random access memory (DRAM) devices. The DRAM devices may be configured as a high-bandwidth memory (HBM) subsystem, with multiple DRAM dies stacked within each device. The memories 208 may comprise logic to configure the parallel processing units 214 to carry out aspects of the techniques disclosed herein.

The processing system 200 includes a general-purpose processor 202, switch 204, and multiple parallel processing units 214 and respective memory 208 modules. The NVLink 210 provides high-speed communication links between the parallel processing unit parallel processing units 214. Although a particular number of NVLink 210 and interconnect 212 connections are depicted in FIG. 2, the number of connections to each parallel processing unit 214 and the general-purpose processor 202 may vary. The switch 204 interfaces between the interconnect 212 and the general-purpose processor 202. The parallel processing units 214, memory 208, and NVLink 210 connections may be situated on a single semiconductor platform to form a parallel processing module 206. In an embodiment, the switch 204 supports two or more protocols to interface between various different connections and/or links.

In embodiments where the one or more general-purpose processors 202 are configured to be the master controller of power allocation, configuration settings to effectuate the process may be set in a non-volatile memory 216 (e.g., a flash memory device) that is either external to or internal to the general-purpose processors 202. Likewise, in embodiments where one or more graphic processing units are configured to be the master controller, the utilized configuration settings may be set in a non-volatile memory 216 (e.g., a flash memory device) that is either external to or internal to the graphics processing units.

In another embodiment (not shown), the NVLink 210 provides one or more high-speed communication links between each of the parallel processing units 214 and the general-purpose processor 202 and the switch 204 interfaces between the interconnect 212 and each of the parallel processing unit modules. The parallel processing unit modules, memory 208, and interconnect 212 may be situated on a single semiconductor platform to form a parallel processing module 206. In yet another embodiment (not shown), the interconnect 212 provides one or more communication links between each of the parallel processing units 214 and the general-purpose processor 202 and the switch 204 interfaces between each of the parallel processing units 214 using the NVLink 210 to provide one or more high-speed communication links between the parallel processing units 214. In another embodiment (not shown), the NVLink 210 provides one or more high-speed communication links between the parallel processing units 214 and the general-purpose processor 202 through the switch 204. In yet another embodiment (not shown), the interconnect 212 provides one or more communication links between each of the parallel processing units 214 directly. One or more of the NVLink 210 high-speed communication links may be implemented as a physical NVLink interconnect or either an on-chip or on-die interconnect using the same protocol as the NVLink 210.

In the context of the present description, a single semiconductor platform may refer to a sole unitary semiconductor-based integrated circuit fabricated on a die or chip. It should be noted that the term single semiconductor platform may also refer to multi-chip modules with increased connectivity which simulate on-chip operation and make substantial improvements over utilizing a conventional bus implementation. Of course, the various circuits or devices may also be situated separately or in various combinations of semiconductor platforms per the desires of the user. Alternately, the parallel processing module 206 may be implemented as a circuit board substrate and each of the parallel processing unit modules and/or memory 208 may be packaged devices. In an embodiment, the general-purpose processor 202, switch 204, and the parallel processing module 206 are situated on a single semiconductor platform.

In an embodiment, each parallel processing unit 214 comprises six NVLink 210 interfaces (as depicted in FIG. 2, five NVLink 210 interfaces are included for each parallel processing unit module). Each NVLink 210 provides data transfer rate in each direction, with six links providing sufficient bandwidth for high-performance computing applications. The NVLink 210 may be used exclusively for PPU-to-PPU communication as shown in FIG. 2, or some combination of PPU-to-PPU and PPU-to-CPU, when the general-purpose processor 202 also includes one or more NVLink 210 interfaces.

In an embodiment, the NVLink 210 enables direct load/store/atomic access from the general-purpose processor 202 to each parallel processing unit module's memory 208. In an embodiment, the NVLink 210 supports coherency operations, allowing data read from the memory 208 to be stored in the cache hierarchy of the general-purpose processor 202, reducing cache access latency for the general-purpose processor 202. In an embodiment, the NVLink 210 includes support for Address Translation Services (ATS), enabling the parallel processing unit 214 to directly access page tables within the general-purpose processor 202. One or more of the NVLink 210 may also be configured to operate in a low-power mode.

Figure 3:
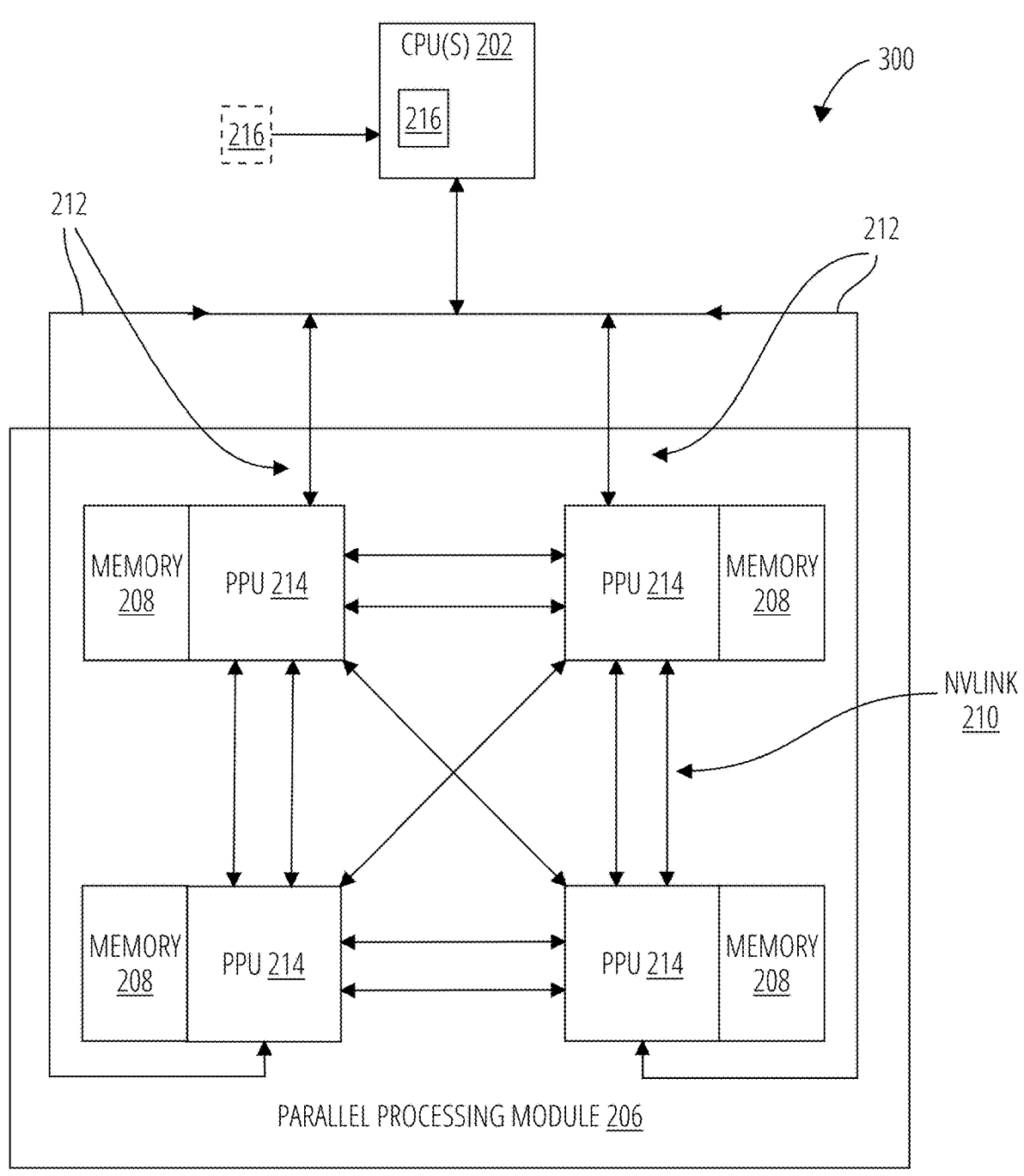
FIG. 3 depicts an exemplary processing system 300 in accordance with another embodiment.

FIG. 3 is a conceptual diagram of a processing system 300 in accordance with another embodiment. The processing system 300 comprises similar features to the processing system 200 depicted in FIG. 2, except that the intervening switch 204 between the parallel processing units 214 and the one or more general-purpose processors 202 is obviated in favor of a more direct link. Obviating the switch 204 may enable higher bandwidth between the parallel processing units 214 and the general-purpose processors 202 and may also reduce circuit area and/or power consumption.

Figure 4:
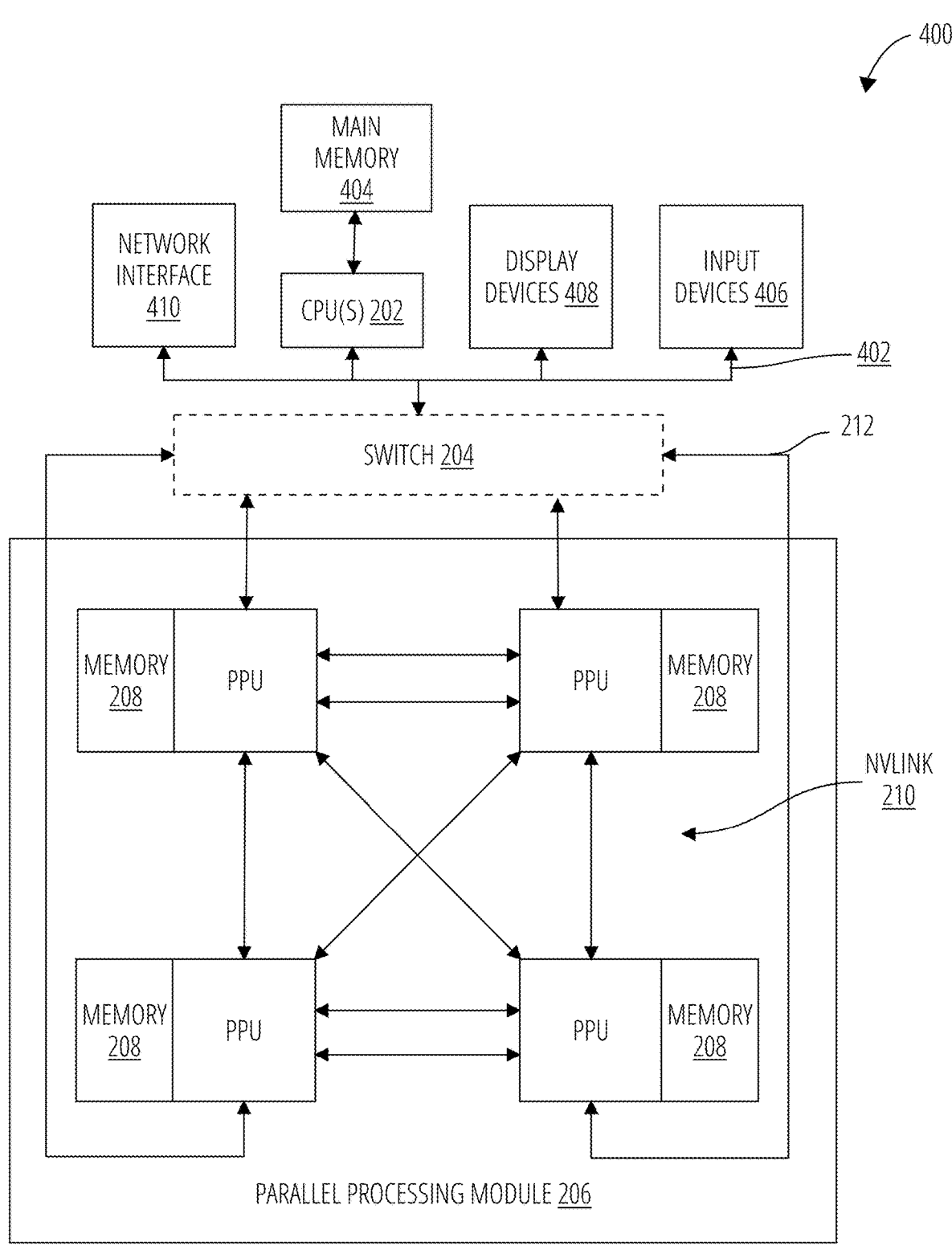
FIG. 4 depicts an exemplary processing system 400 in accordance with another embodiment.

FIG. 4 depicts an exemplary processing system 400 in which the various architecture and/or functionality of the various previous embodiments may be implemented. As shown, an exemplary processing system 400 is provided including at least one general-purpose processor 202 that is connected to a communications bus 402. The communication communications bus 402 may be implemented using any suitable protocol, such as PCI (Peripheral Component Interconnect), PCI-Express, AGP (Accelerated Graphics Port), HyperTransport, or any other bus or point-to-point communication protocol(s). The exemplary processing system 400 also includes a main memory 404. Control logic (software) and data are stored in the main memory 404 which may take the form of random access memory (RAM). As noted previously, the switch 204 may not be utilized in some platform implementations, and instead the (one or more) general-purpose processor 202 and the parallel processing units 214 may utilize a more direct connection without the intervening switch 204.

The exemplary processing system 400 also includes input devices 406, the parallel processing module 206, and display devices 408, e.g. a conventional CRT (cathode ray tube), LCD (liquid crystal display), LED (light emitting diode), plasma display or the like. User input may be received from the input devices 406, e.g., keyboard, mouse, touchpad, microphone, and the like. Each of the foregoing modules and/or devices may even be situated on a single semiconductor platform to form the exemplary processing system 400. Alternately, the various modules may also be situated separately or in various combinations of semiconductor platforms per the desires of the user.

Further, the exemplary processing system 400 may be coupled to a network (e.g., a telecommunications network, local area network (LAN), wireless network, wide area network (WAN) such as the Internet, peer-to-peer network, cable network, or the like) through a network interface 410 for communication purposes.

The exemplary processing system 400 may also include a secondary storage (not shown). The secondary storage includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 404 and/or the secondary storage. Such computer programs, when executed, enable the exemplary processing system 400 to perform various functions. The main memory 404, the storage, and/or any other storage are possible examples of computer-readable media.

The architecture and/or functionality of the various previous figures may be implemented in the context of a general computer system, a circuit board system, a game console system dedicated for entertainment purposes, an application-specific system, and/or any other desired system. For example, the exemplary processing system 400 may take the form of a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, a mobile phone device, a television, workstation, game consoles, embedded system, and/or any other type of logic.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Figure 5:
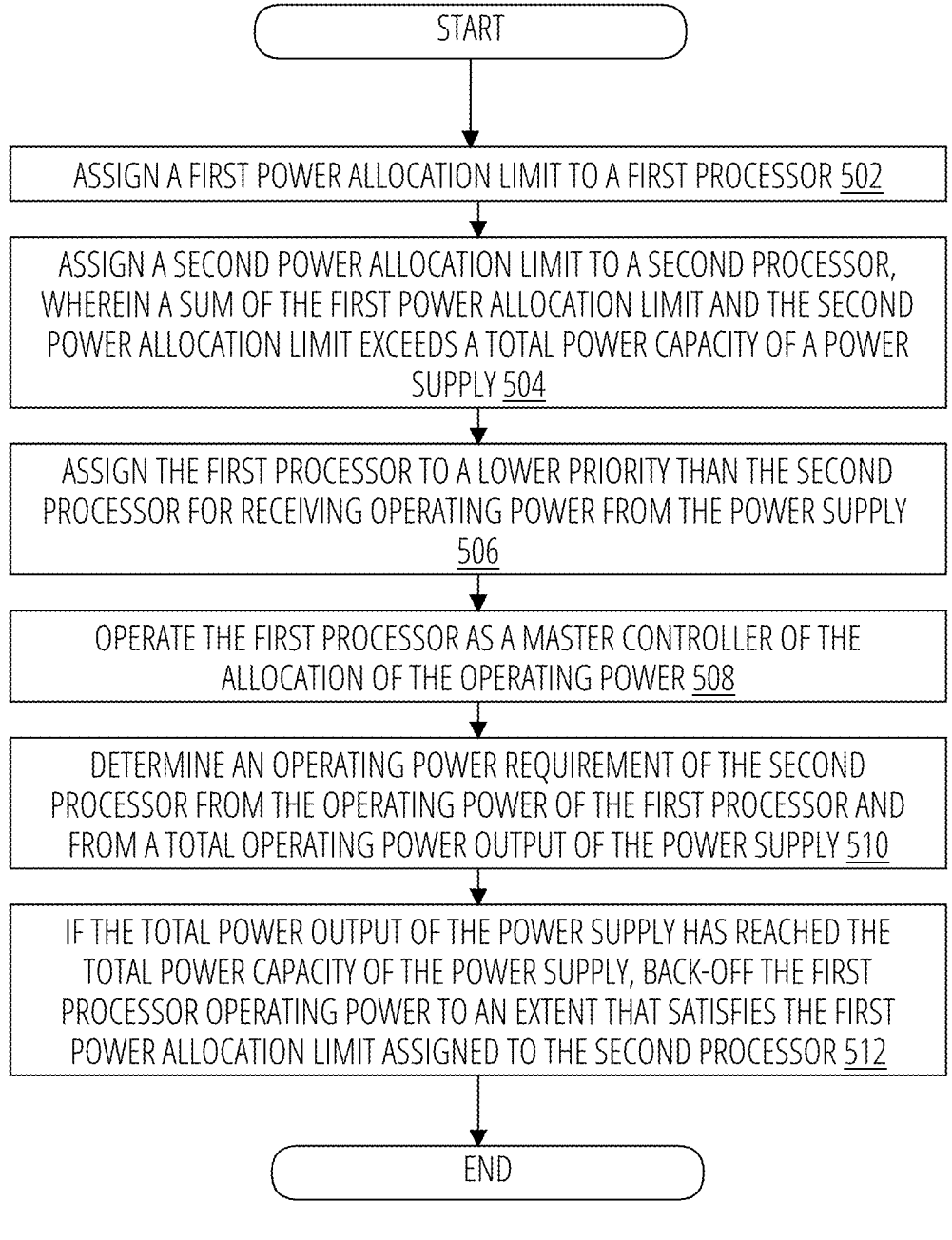
FIG. 5 depicts a power allocation process in accordance with one embodiment.

FIG. 5 depicts a power management process in one embodiment. Although described in this example in terms of power management between processors (e.g., CPUs and GPUs), the mechanism is more generally applicable to power sharing/power management between any number chips, die, or other components sharing a same power source in a device. It should be further understood that the 'first' processor or chip may in fact comprise a group of multiple processors or chips in some implementations. Likewise, the 'second' processor or chip may in fact comprise a group of multiple processors or chips in some implementations.

At 502, a first power allocation limit is assigned to/associated with a first processor. In some embodiments, this first limit may be implicit in that the first processor may have an inherent limit on the power it can draw from the power supply. At 504, a second power allocation limit is assigned to/associated with a second processor, wherein a sum of the first power allocation limit and the second power allocation limit exceeds a total power capacity of a power supply.

At 506, the first processor assigns/associates a lower priority to itself than to the second processor for receiving operating power from the power supply. This assignment/association need not be explicit, but may rather be implicit in how the first processor manages the power sharing between itself and the second processor.

At 508, the first processor is operated as a master controller of the allocation of the operating power from the power supply between itself and the second processor. At 510 the first processor determines an operating power requirement of the second processor from the operating power it is itself drawing and from a total operating power output of the power supply. At 512, if the total power output of the power supply has reached the total power capacity of the power supply, the first processor backs off its own operating power to an extent that satisfies the first power allocation limit assigned to the second processor.

In this process the master control function of the first processor obviates any handshaking or signaling between the first processor and the second processor. The master control function of the first processor also obviates the need for the second processor to monitor system power consumption, or to have knowledge of the first processor's power limit or capacity, or to have knowledge of system power capacity, or even to have knowledge of its own power capacity.

A configured power budget may be overprovisioned for two or more integrated circuit components in a system. For example, if the total available system power is 1000 W, and the system includes one GPU and one CPU, the system may be configured with settings indicating that the GPU is prioritized for power allocation and may receive up to 900 W. The system may be configured to indicate that the CPU may receive up to 500 W, or this maximum power draw by the CPU may be intrinsic. Combined, the two components as provisioned may utilize 1400 W total, which exceeds the system power supply capacity by 400 W. The configured power budget of the two components is thus overprovisioned by 400 W. Although the total provisioned power exceeds the output limit of the system power supply, neither of the individual component provisions exceed this limit.

The system may be configured in one example to prioritize power consumption by the GPU. In this scenario the unprioritized component, the CPU, monitors the output of the system power supply. The CPU also monitors how much of that power is being consumed by itself. If the system power output is at its limit, it's possible that the workload on the prioritized GPU component will benefit from applying more power to the GPU. In this case, the CPU calculates the extent to which the GPU is operating below its full provisioning of power:

$$P_{GPU} = P_S - P_{CPU}$$

where $P_{GPU}$ is the power consumption, $P_S$ is the system power output/capacity, and $P_{CPU}$ is the CPU power consumption; and $$P_{GPU\_u} = P_{GPU\_p} - P_{GPU}$$

where $P_{GPU\_u}$ is the amount of GPU under allocation and $P_{GPU\_p}$ is the GPU provisioned power.

If the prioritized component's under allocation is not zero, it's possible that the prioritized component could operate at higher performance if it received more power. In this case the non-prioritized component may reduce its power consumption to accommodate the prioritized component receiving up to its allocated maximum. However, the extent to which the non-prioritized component reduces its power consumption is constrained by one or both of the following: the non-prioritized component will not reduce its power consumption below a floor limit required for its proper operation, or, below a floor limit that could enable the prioritized component to draw more than its allocated maximum power. The latter constraint may come into play in an implementation in which the provisioned maximum power allocation for the prioritized component is the power level beyond which the prioritized component will heat in excess of its thermal operating limit.

In operating situations where the non-prioritized component is also executing some portion of the high-priority workload, the reduction in the non-prioritized component power consumption may further be limited (have a floor value) at the minimum intrinsic power required by the non-prioritized component to execute its portion of the high-priority workload. Thus the floor value of the power consumption of the non-prioritized component may vary according to the nature of its extant workload. Regardless of the circumstances, the non-prioritized component controls all aspects of the power sharing allocation with the prioritized component, without the use of intercomponent signaling.

As noted above, the setting that indicates which component (or group of components) is prioritized for power consumption may be a setting in a memory (volatile or non-volatile) of the system. The setting may altered during system operation without changes to the hardwiring of the system. The setting indicates which component(s) (the non-prioritized one(s)) operates as the master controller of the runtime power allocation. In a system comprising a CPU and a GPU for example, this means that both the CPU and the GPU are configured to respond to the setting to operate in the system as the non-prioritized component.

Figure 6:
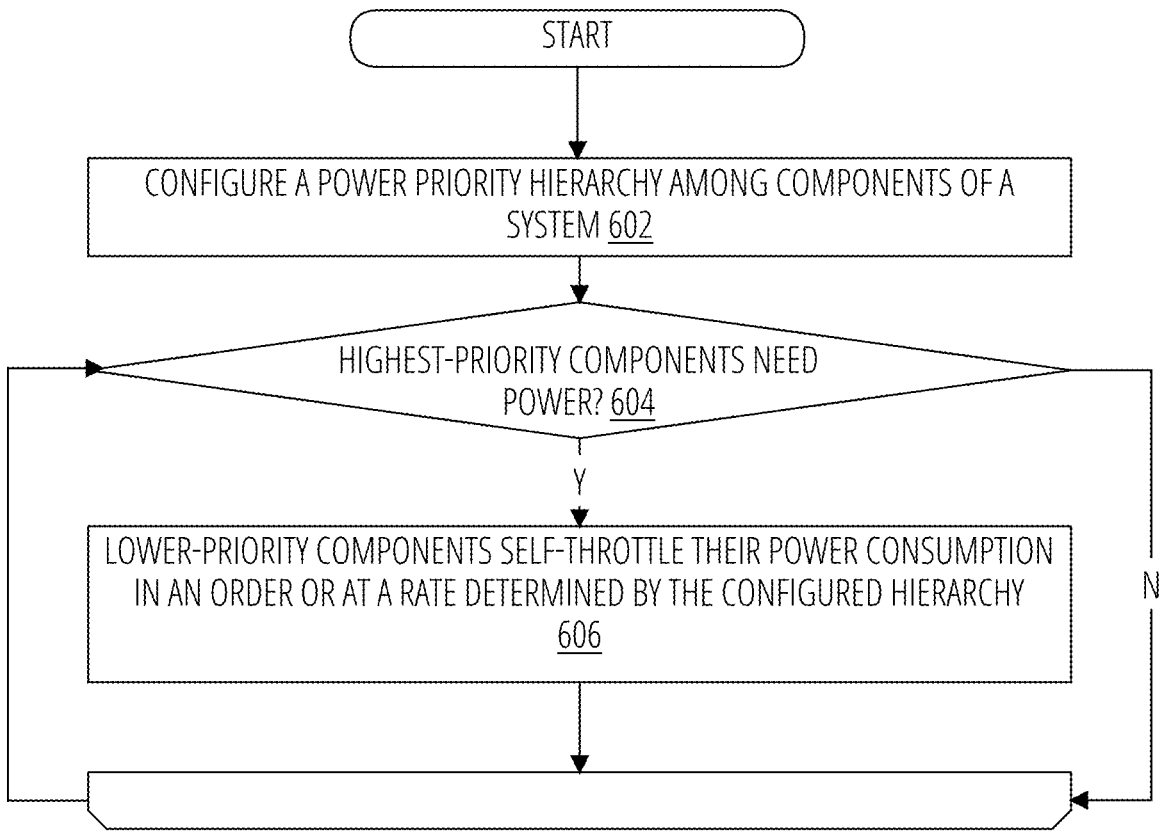
FIG. 6 depicts a power allocation process in accordance with another embodiment.

FIG. 6 depicts a process for dynamic power allocation among N>2 devices in one embodiment. Each of the priority hierarchy of N devices contends for power from the same supply. Each component (other than the highest priority one(s)) controls power allocation among itself and the other components by throttling for the benefit of higher priority components. A power allocation priority is configured among components of the system (602). If an operating condition arises in which the highest priority components may be short on power (604), the lower priority components self-throttle their own power consumption in an order or pace determined by the configured hierarchy (606).

For example, the system may comprise configuration settings that indicate device 1 (D1) is lowest priority, D2 is next lowest priority, and D3 is highest priority for receiving allocations of system power. (D3 need not have an explicit priority setting due to being highest priority for power based on the settings for D1 and D2) During some point during system operation, system power output may be maxed out, and D3 is receiving less than its configured maximum allocation despite executing a high-value workload. As an initial remediation of this condition, D1 may reduce its own power budget by an amount of under-allocation of power to D3, or down to D1's floor limit, whichever is greater. If that reduction does not satisfy D3's under-allocation, D2 throttles its own power budget subject to its own floor limit.

In one embodiment, to maintain the signaling independence between the components, components in each level of the hierarchy may throttle subject to a configured latency. Components at a lowest level of the hierarchy may throttle with the lowest latency (e.g., they may check for under-powering of the highest priority components and throttle at a faster pace than components at other levels). Components at higher levels of priority may check and throttle, if needed, at a progressively slower pace. Thus, the system may comprise configuration settings that indicate device 1 (D1) is lowest latency/pace to throttle in response to changing power demands and D2 is next lowest in latency/pace. (D3 need not have a latency or pace setting due to being highest priority for power, and hence not performing any self-throttling).

Because the components manage the power budget amongst themselves without signaling one another, the priority and allocation settings may be configured into the components themselves (e.g., into the firmware of the component(s)). In multi-priority systems, each component may have settings configured in firmware for the higher-priority component allocations, and each component may be configured to back-off its power consumption at a particular latency/rate that depends on its order in the hierarchy (e.g., lower priority components back off at a faster response rate than higher ones).

In some embodiments, a group of two or more components may be assigned a same power allocation priority. In this case, if the group is not the highest priority group, each component in the group may back off its power consumption by a pro-rata amount (which may be equal among components in the group, or different between some or all of them) of the total needed to provide the higher priority component or group with the power demands of a high-value load, subject to an allocation limit for the highest priority group.

LISTING OF DRAWING ELEMENTS 100 computing system
102 interconnect system
104 memory
106 CPU(s)
108 GPU(s)
110 communication interface
112 I/O ports
114 I/O components
116 power supply
118 presentation component(s)
120 logic unit(s)
200 processing system
202 general-purpose processor
204 switch
206 parallel processing module
208 memory
210 NVLink
212 interconnect
214 parallel processing unit
216 non-volatile memory
300 exemplary processing system
302 communications bus
304 main memory
306 input devices
308 display devices
310 network interface Various functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on. "Logic" refers to machine memory circuits and non-transitory machine readable media comprising machine-executable instructions (software and firmware), and/or circuitry (hardware) which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter). Logic symbols in the drawings should be understood to have their ordinary interpretation in the art in terms of functionality and various structures that may be utilized for their implementation, unless otherwise indicated.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

Although the terms "step" and/or "block" may be used herein to connote different elements of methods employed, the terms should not be interpreted as implying any particular order among or between various steps herein disclosed unless and except when the order of individual steps is explicitly described.

Having thus described illustrative embodiments in detail, it will be apparent that modifications and variations are possible without departing from the scope of the intended invention as claimed. The scope of inventive subject matter is not limited to the depicted embodiments but is rather set forth in the following Claims.

What is claimed is:

1. A system comprising:
a power supply;
a first chip or die;
a second chip or die;
a non-volatile memory comprising settings that when applied to the first chip or die, configure the first chip or die to:
associate a power allocation limit with the second chip or die, wherein a sum of the power allocation limit and a power consumption limit of the first chip or die exceeds a total power capacity of the power supply;
operate the first chip or die at a lower priority than the second chip or die for receiving operating power from the power supply; and operate as a master controller of allocation of the operating power from the power supply to the first chip or die and to the second chip or die.

2. The system of claim 1, wherein the first chip or die comprises a general purpose processor.

3. The system of claim 1, wherein the second chip or die comprises a graphics processing unit.

4. The system of claim 1, wherein the first chip or die is further configured to:
determine, from its own operating power and from a total operating power output of the power supply, an operating power requirement of the second chip or die.

5. The system of claim 4, wherein the first chip or die is configured to:
on condition that the total power output of the power supply has reached the total power capacity of the power supply, back-off its own operating power to an extent that satisfies the first power allocation limit assigned to the second chip or die.

6. The system of claim 5, wherein the extent of the back-off is subject to a lower operating power limit of the first chip or die.

7. The system of claim 1, wherein the power allocation limit and the operating power priority are configured by settings in a flash memory.

8. The system of claim 7, wherein the first chip or die comprises the flash memory.

9. The system of claim 7, wherein the flash memory is external to the first chip or die.

10. A system comprising:
a power supply;
at least one first processor;
at least one second processor;
the system configured to:
assign a first power allocation limit to the at least one first processor;
assign a second power allocation limit to the at least one second processor, wherein a sum of the first power allocation limit and the second power allocation limit exceeds a total power capacity of the power supply;
assign to the at least one first processor a lower priority than the at least one second processor for receiving operating power from the power supply; and
operate the at least one first processor as a master controller of allocation of the operating power.

11. The system of claim 10, wherein the at least one first processor comprises at least one general purpose processor.

12. The system of claim 10, wherein the at least one second processor comprises at least one graphics processing unit.

13. The system of claim 10, wherein the at least one first processor is configured to:
determine, from its own operating power and from a total operating power output of the power supply, an operating power requirement of the at least one second processor.

14. The system of claim 13, wherein the at least one first processor is configured to:
on condition that the total power output of the power supply has reached the total power capacity of the power supply, back-off its own operating power to an extent that satisfies the first power allocation limit assigned to the at least one second processor.

15. The system of claim 14, wherein the extent of the back-off is subject to a lower operating power limit of the first processor.

16. The system of claim 10, wherein the first power allocation limit, the second power allocation limit and the first processor operating power priority are configured by settings in a read-only memory.

17. The system of claim 16, wherein the at least one first processor comprises the read-only memory.

18. The system of claim 16, wherein the read-only memory is external to the at least one first processor.

19. The system of claim 10, wherein the at least one first processor comprises multiple processors N>1, and each of the multiple processors is configured to:

on condition that the total power output of the power supply has reached the total power capacity of the power supply, back-off its own operating power to a pro-rata extent that satisfies the first power allocation limit assigned to the at least one second processor.

20. A method comprising:

assigning a first power allocation limit to a first processor;

assigning a second power allocation limit to a second processor, wherein a sum of the first power allocation limit and the second power allocation limit exceeds a total power capacity of a power supply;

assigning the first processor to a lower priority than the second processor for receiving operating power from the power supply;

operating the first processor as a master controller of the allocation of the operating power;

determining an operating power requirement of the second processor from the operating power of the first processor and from a total operating power output of the power supply; and if the total power output of the power supply has reached the total power capacity of the power supply, backing-off the first processor operating power to an extent that satisfies the first power allocation limit assigned to the second processor.

\*　\*　\*　\*　\*